United States Patent

Bratek

[15] 3,656,671

[45] Apr. 18, 1972

[54] FRANGIBLE PROJECTION REMOVAL

[72] Inventor: Richard J. Bratek, Burlington, Vt.

[73] Assignee: International Business Machines Corporation, Armonk, N.Y.

[22] Filed: Mar. 16, 1970

[21] Appl. No.: 19,675

[52] U.S. Cl. ....................................225/1, 225/93, 225/103

[51] Int. Cl. ..........................................................B26f 3/00

[58] Field of Search ........................................225/1, 103, 93

[56] References Cited

UNITED STATES PATENTS

| | | | |
|---|---|---|---|
| 237,221 | 2/1881 | Westervelt | 225/1 |
| 2,280,204 | 4/1942 | Tracy | 225/1 |

*Primary Examiner*—Frank T. Yost
*Attorney*—Littlepage, Quaintance, Wray and Aisenberg

[57] ABSTRACT

Frangible epitaxial projections on a semiconductor wafer which is susceptible to abrasive damage are removed by forcing a rigid glass plate toward the projections and surfaces of the wafer, with pressures sufficient to break projections extending greater than two microns from the surface. Vacuum greater than about 25 inches of mercury is used to pull the plate down on the projections. After the plate is removed from the wafer, broken projections are removed by washing the chip sequentially in ultrasonically vibrated baths.

16 Claims, 3 Drawing Figures

PATENTED APR 18 1972 3,656,671

INVENTOR
RICHARD J. BRATEK

Littlepage, Quaintance, Wray & Aisenberg
ATTORNEYS

FRANGIBLE PROJECTION REMOVAL

BACKGROUND OF THE INVENTION

Removing surface irregularities from materials which are subject to damage by abrading has long posed a problem. The problem is especially acute in, for example, the making of semiconductor devices.

In well known procedures, semiconductor materials are coated with photoresist, a mask is placed over the photoresist, and the photoresist is exposed with light in desired areas. Portions of the photoresist are washed away, and the semiconductor material is coated or treated with an impurity in the areas in which photoresist is absent. Any irregularities in the surface of the semiconductor materials may affect the quality of the final product. Surface projections are detrimental to the successful completion of intermediate steps of manufacturing the semiconductor elements. When photoresist and masks are applied, the projections prevent the masks from uniformly contacting the photoresist. When light is applied to expose the photoresist, the lines between the exposed and unexposed photoresist are not as sharp as desired and a defect commonly known as webbing (i.e., a discontinuous image) occurs. In addition, the projections seriously damage the delicate chrome masks and emulsion masks which are used in exposing the photoresist with the result that the expensive masks cannot be dependably used for more than a few processes.

Although masks have been previously applied with vacuum holddown alignment and fixtures, the procedures and pressures and forces used in known alignment devices and operations do not crush epitaxial spikes and mounds to any appreciable extent. In known operations, the small pressure of application of masks has been maintained at a low level in order to avoid undue damage to the masks or to avoid supposed damage to the wafers which were heretofore thought to be susceptible to breakage by squeezing.

The problems of mask damage and webbing have persisted in the manufacture of semiconductor devices. The problem has mainly been addressed by inspection of the devices and by the rejecting of a high rate of units due to the webbing, and in the use of the delicate masks only two or three times.

The nature of the problem may be understood with reference to particular semiconductor devices which are under construction at the present time. Complex integrated circuits are fabricated in a number of chips in a semiconductor wafer, which typically has a diameter of 1 ¼ inches. For example, a 64 bit, three dimensionally organized monolithic silicon memory chip is 0.112 inches square. That chip contains 664 components, both transistors and passive elements, which results in a device density of 53,000 per square inch and in a chip bit density of 6,000 per square inch. Destruction of the delicate masks which are necessary to create such chips represents an important economic loss. Webbing causes high chip rejection, which creates higher costs of production.

SUMMARY OF THE INVENTION

The objectives of this invention are accomplished by bringing a plate into contact with unwanted frangible surface projections and pressing the plate toward a surface bearing the projections in a direction generally normally thereto, and breaking the projections and removing the debris. The plate has a surface which is similar and complementary to the surface from which the projections are being removed. In a preferred form of the invention, both surfaces are flat. The pressing of the surfaces together is accomplished in a preferred embodiment using a precisely controlled amount of pressure between the crushing element and the surface from which the projections are to be removed. In a preferred form, the crushing element is drawn toward the surface by a vacuum greater than 25 inches of mercury.

Removing of the debris from the surface is best accomplished by immersing the surface in a liquid bath. Preferably, the liquid is vibrated with ultrasonic vibration in a well known manner.

When the invention is employed with semiconductor devices, it is usually best to mount the semiconductor device on a hard rubber surface which is rigid but somewhat deformable. The hard rubber surface may have a porous central portion in order to transmit reduced pressure for holding the semiconductor device stable on the hard rubber. Surrounding the hard rubber is a vacuum chamber ring, and a glass plate overlies the semiconductor material and the vacuum chamber ring. A vacuum drawn within the ring pulls the plate and semiconductor surface together. Increasing the vacuum to above 25 inches of mercury crushes the epitaxial spikes on the surface of the semiconductor. The vacuum is broken by pressing the hard rubber base and the semiconductor against the glass plate and further breaking the projections while also breaking the seal between the plate and vacuum chamber ring. Thereupon, the glass plate is removed and the semiconductor wafer is transferred to successive ultrasonic baths. A first ultrasonic cleaning in alcohol carries away fine particles of the crushed projections. A second ultrasonic bath in water carries away electrostatically charged crushed particles and large broken particles from the wafer. A third bath in alcohol dewets and dries the wafers. While the invention has particular application in the manufacture of varied fine articles which cannot tolerate abrading such as semiconductor wafers and integrated circuit chips, the invention also finds employment with any surface from which it is desired to crush and remove frangible projections. The particular advantages of the invention are especially realized when removing frangible projections from surfaces which are susceptible to abrasive damage.

The invention has as one object the provision of a method for removing unwanted frangible surface projections by forcing a crushing element toward the projections in a direction substantially normal to the surface and removing broken debris of the projection.

Another object of the invention is the provision of a method for removing frangible protrusions extending from a surface subject to damage by abrading in which a crushing element and a surface having unwanted protrusions are drawn together by a vacuum with sufficient force which is necessary to crush principal protrusions followed by the removal of debris from the crushed protrusions.

This invention has as a further objective the provision of a method for reducing epitaxial spike and mound heights on semiconductor wafers by drawing an uncoated glass plate toward a wafer surface having the spikes and mounds, removing the glass plate and immersing the wafers in an ultrasonic bath to wash away crushed debris from the spikes and mounds.

The foregoing and other objects, features and advantages of the invention will be apparent from the following more particular description of a preferred embodiment of the invention, as illustrated in the accompanying drawings.

DETAILED DESCRIPTION OF THE DRAWINGS

Figure 1:
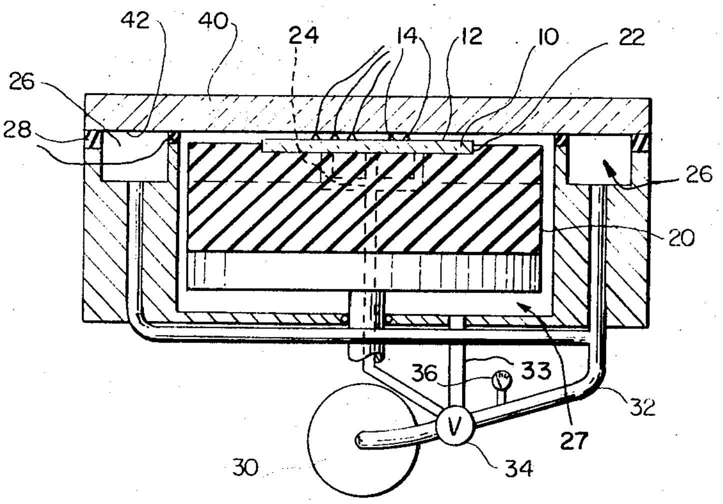
FIG. 1 is a schematic detail of a first step in the method of the present invention in which a glass plate is brought into contact with spikes and mounds on a semiconductive device, using a vacuum.

Referring to FIG. 1, a silicon semiconductor wafer generally indicated by the numeral 10 has an epitaxial layer 12 in which an impurity is to be deposited in selected areas. During growth of the epitaxial layer 12 unwanted spikes and mounds 14 are produced due to crystal imperfections in the wafer 10, minute contaminant particles on the wafer, and the like. To remove the unwanted spikes and mounds, wafer 10 is placed on a hard rubber pad 20. The pad 20 may be made of any low resilience material, preferably elastomeric in nature. The hard rubber pad may have a central depressed area 22 which is fitted to wafer 10. A vacuum through pores 24 holds wafer 10 firmly in position on the pad. A ring-like vacuum chamber 26 surrounds the pad, and a circumferential seal 28 surrounds chamber 26. If desired, a similar circular seal may be placed between vacuum chamber 26 and pad 20.

Pump 30 draws vacuum in chambers 26 and 27 through lines 32 and 33, respectively. Valve 34 may be used to control the vacuum within lines 32 and 33 and chambers 26 and 27. Gauge 36 indicates the condition of vacuum in the device.

Glass plate 40 has a flat lower face 42 which overlies surface 12 of the semiconductor wafer 10. Semiconductor wafer 10 and glass plate 40 are drawn together.

Figures 2, 3:
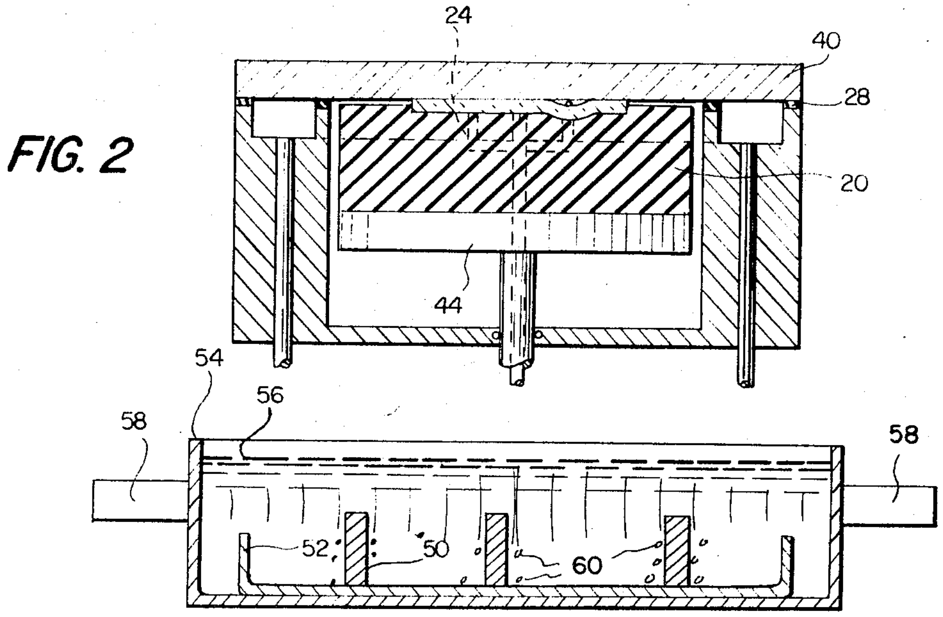
FIG. 2 is a showing of the second step in the method, in which the plate and semiconductor device are pressed together.
FIG. 3 schematically represents a final step of the method in which debris is removed by an ultrasonic bath.

As vacuum is drawn with pump 30, face 42 and surface 12 are drawn together, crushing spikes and mounds 14 as shown in FIG. 2. Full available vacuum from the source 30 is desirable. Preferably, the vacuum is drawn very rapidly, to produce an impact between the glass plate 40 and wafer 10. As exaggerated in FIG. 2, the wafer may be somewhat flexed in the immediate area of spikes and mounds. Flexure of the wafer may account for the crushing of only those mounds and spikes more than 2 microns in height.

Crushing is completed by pressing upward on piston 44, which further crushes the spikes and eventually breaks seal 28 to release the vacuum. Thereafter, the glass plate is removed and the semiconductor devices are placed upon trays or boats for removal of the crushed debris. As schematically shown in FIG. 3, semiconductor wafers 50 are placed on boats 52 which are submerged in ultrasonic tank 54. Liquid 56, which is preferably alcohol or water, is vibrated by the application of ultrasonic waves from transducers 58. Debris 60 from the crushing operation is therefore removed from wafers 50.

All of the features of the drawings have been exaggerated for clarity in understanding the method of the invention. Common undesired mounds and spikes which result from epitaxial deposition are usually about 30 or 40 microns in height. Spikes and mounds greater than 2 microns in height are reduced or removed using the steps of the present invention.

A wafer which is 1 ¼ inches in diameter may be placed on a pad which is surrounded by a vacuum chamber having an outer diameter of approximately 3 ½ inches. A force of about 100 to about 150 pounds on a 1 ¼ inch diameter wafer is produced by breaking the vacuum in such a chamber in the manner described above, which is useful in complete crushing of spikes and mounds epitaxially formed on the surface of such a wafer.

Several tests using conventional and commercially available apparatus with recognized procedures have supported the efficacy of the present method.

Using normal production and inspection techniques, the defect count of production wafers has significantly dropped.

In a specific test, ten wafers are inspected under oblique light to find spikes. Spikes were measured under a Reichert microscope, and location of the spikes was marked on an array corresponding to this location on the wafer. Spikes were crushed by a vacuum of about 28 inches of mercury, and the wafers were cleaned ultrasonically and measured. Spikes were crushed a second time and cleaned ultrasonically and measured again.

At the initial inspection, 21 spikes were located and measured on 10 wafers. The average height of the spikes was 21.2 microns, the biggest being 54 microns, and the smallest 8 microns.

After the first crushing and cleaning, spikes averaged 9.8 microns with the biggest being 18 microns and the smallest 0 microns. The spikes were reduced an average of 11.4 microns, the greatest reduction being 29 microns, and the smallest reduction being 4 microns. On the average spike height was reduced by 53.7 percent.

After the second crushing and cleaning, the average height of the spikes was 5 microns, the biggest being 20 microns, and the smallest being 0 microns. The spikes were reduced by an average of 4.9 microns, the biggest reduction being 16 microns, and the smallest reduction being 0 microns. Total average reduction in spike height was 16.14 microns, with the greatest reduction being 36 microns and the smallest reduction being 5 microns. The average total reduction in height was 76.2 microns.

In another test, wafers were removed from a production lot prior to a third oxidation and were inspected for epitaxial spikes and mounds. The wafers were then split randomly into half lots, and the first half lot was subjected to the spike crushing method of the present invention. The half lot that was subjected to crushing showed a 49 percent decrease in the total number of chips affected by webbing.

It has been found through tests of wafers and through visual inspection of masks, that masks employed with spike crushed wafers may be used to expose an average of from 300 to 500 or more wafers. Previously, mask damage due to spikes required replacement of masks after they were used on an average of 30 wafers.

While the invention has been particularly shown and described with reference to a preferred embodiment thereof, it will be understood by those skilled in the art that various changes in form and details may be made therein without departing from the spirit and scope of the invention.

What is claimed is:

1. The method of removing unwanted frangible projections from a surface comprising positioning a rigid element adjacent the projections and spaced from the surface and moving the element and the surface together in a direction substantially normal to the surface with a force sufficient to fracture the projections, separating the element and the surface, and removing projection debris from the surface.

2. The method of claim 1 wherein the removing step comprises passing a fluid over the surface and separating debris from the surface and taking away debris in the fluid.

3. The method of claim 1 wherein the removing step comprises contacting the surface with a liquid and taking away debris in the liquid.

4. The method of claim 1 wherein the removing step comprises immersing the surface in a liquid and ultrasonically vibrating the liquid.

5. The method of claim 1 wherein the surface is a surface of a semiconductor wafer, wherein the projections are epitaxial spikes and mounds, wherein the positioning step comprises positioning a flat glass plate adjacent the epitaxial spikes and mounds, and wherein the moving step comprises moving the flat glass plate toward the surface of the semiconductor wafer with a force sufficient to break prominent spikes and mounds.

6. The method of claim 1 wherein the moving step comprises drawing an uncoated planar glass plate to epitaxial surface irregularities on a semiconductor wafer.

7. The method of claim 1 wherein the moving step comprises applying a vacuum to the element and drawing the element and the surface together with the vacuum.

8. The method of claim 7 wherein the applying step comprises applying a vacuum greater than from about 25 inches of mercury to the plate and thereby drawing the plate toward the surface.

9. The method of claim 7 further comprising pressing the surface toward the element for breaking the projections and for pushing the element away from a vacuum source.

10. The method for removing frangible protrusions extending from a surface susceptible to abrasive damage comprising positioning a rigid element adjacent the surface, applying substantially normally on the element and the surface compressive pressure sufficient to break the protrusions, and cleaning debris of broken protrusions from the surface.

11. The method of claim 10 wherein the cleaning step comprises contacting the surface and the debris liquid in an ultrasonic bath.

12. The method of claim 10 wherein the protrusions comprise epitaxially formed surface irregularities on a surface of a semiconductor wafer and wherein the positioning step comprises positioning a flat side of a hard element adjacent the surface.

13. The method of claim 12 wherein the pressure applying step further comprises applying pressure sufficient to break epitaxially formed surface irregularities greater than about 2 microns.

14. The method for removing unwanted irregular epitaxial growths from a surface of a semiconductor wafer comprising supporting the wafer on a hard rubber base, positioning an uncoated glass plate over the wafer, applying a vacuum of greater than about 25 inches of mercury to a lower portion of the glass plate, and thereby drawing the glass plate and wafer together with forces sufficient to crush unwanted epitaxially formed irregularities, releasing vacuum from the glass plate, removing the plate from the wafer, and cleaning debris of crushed irregular growths from the wafer.

15. The method of claim 14 wherein the drawing step comprises drawing the plate toward the wafer with force sufficient to crush epitaxially formed surface irregular growths with dimensions greater than 2 microns from the surface of the wafer.

16. The method of claim 14 wherein the cleaning step comprises sequentially contacting debris and the wafer with ultrasonically vibrated baths of alcohol, of water, and of alcohol.

* * * * *